(12) United States Patent
Miyanaga

(10) Patent No.: US 8,639,959 B2
(45) Date of Patent: Jan. 28, 2014

(54) SEMICONDUCTOR APPARATUS HAVING A CONTROLLER ARRANGED TO TURN ON A FIRST SWITCH AND TURN OFF A SECOND SWITCH DURING A PERIOD IN WHICH A JUDGEMENT UNIT JUDGES A DEVICE TYPE OF A DEVICE

(75) Inventor: Koichi Miyanaga, Kyoto (JP)

(73) Assignee: Rohm Co., Ltd. (JP)

( * ) Notice: Subject to any disclaimer, the term of this patent is extended or adjusted under 35 U.S.C. 154(b) by 493 days.

(21) Appl. No.: 12/897,454

(22) Filed: Oct. 4, 2010

(65) Prior Publication Data

US 2012/0023344 A1     Jan. 26, 2012

(30) Foreign Application Priority Data

Oct. 2, 2009    (JP) .................................. 2009-231006
Oct. 2, 2009    (JP) .................................. 2009-231007
Sep. 2, 2010    (JP) .................................. 2010-196402

(51) Int. Cl.
*G06F 1/32*    (2006.01)

(52) U.S. Cl.
USPC ........................................ 713/324; 710/316

(58) Field of Classification Search
None
See application file for complete search history.

(56) References Cited

U.S. PATENT DOCUMENTS

| 8,234,433 B2 * | 7/2012 | Markel et al. ................. 710/302 |
| 2007/0147412 A1 * | 6/2007 | Wei et al. ...................... 370/463 |
| 2010/0070659 A1 * | 3/2010 | Ma et al. ......................... 710/14 |

FOREIGN PATENT DOCUMENTS

| JP | 61-8677 A | 1/1986 |
| JP | 3-49418 A | 3/1991 |
| JP | 6-276503 A | 9/1994 |
| JP | 9-219935 A | 8/1997 |
| JP | 2009-71534 A | 4/2009 |

* cited by examiner

*Primary Examiner* — Kenneth Kim
(74) *Attorney, Agent, or Firm* — Cantor Colburn LLP

(57) ABSTRACT

A first switch is arranged between a judgment unit and a signal line. The first switch is turned on during a period in which the judgment unit judges a device, after which the first switch is turned off. A second switch is turned off during a period in which the judgment unit judges the device, after which the second switch is turned on. The signal line connects a communication interface port, which allows various different kinds of devices to be connected, and a communication terminal of a processor configured to perform data communication with the device. The judgment unit monitors the electrical state of the signal line, and judges the device connected to the port.

12 Claims, 6 Drawing Sheets

42a

SEMICONDUCTOR APPARATUS HAVING A CONTROLLER ARRANGED TO TURN ON A FIRST SWITCH AND TURN OFF A SECOND SWITCH DURING A PERIOD IN WHICH A JUDGEMENT UNIT JUDGES A DEVICE TYPE OF A DEVICE

BACKGROUND OF THE INVENTION

1. Field of the Invention

The present invention relates to a semiconductor apparatus to which various different kinds of devices can be connected.

2. Description of the Related Art

1. A USB (Universal Serial Bus) port (interface) is mounted on various kinds of electronic devices such as cellular phones, PDAs (Personal Digital Assistants), laptop personal computers, etc. Various kinds of devices can be connected via a USB port. The electronic device judges whether a device is connected via the USB port, what kind of device is connected via the USB port, and the state of the device thus connected. Subsequently, the electronic device transits to an appropriate operation mode according to the judgment result. In many cases, various kinds of interfaces other than a USB port also must identify what kind of device is connected via a connector and identify the state of the connected device.

2. Furthermore, various kinds of electronic circuits such as CPUs (Central Processing Units) and DSPs (Digital Signal Processors) which are each configured to perform digital signal processing, liquid crystal panels, and other kinds of analog circuits and digital circuits, etc., are mounted on various kinds of electronic devices such as cellular phones, PDAs (Personal Digital Assistants), laptop personal computers, etc. With battery-driven electronic devices mounting a battery as a power supply, each electronic circuit included within the device operates using the battery voltage supplied by the battery.

Electronic devices are known having a function of receiving electrical power supplied from an external power supply via an AC adapter, USB (Universal Serial Bus) port, or the like. Such an arrangement enables operation to be performed even if the remaining battery charge becomes low, or even if a battery is not mounted on the electronic device. With such an arrangement, a power supply management circuit (power management IC) is provided, which performs a control operation for switching the voltage that is to be used to operate the electronic device between the voltage supplied from the external power supply and the voltage supplied from the battery. In a case in which the battery is a rechargeable battery such as a lithium-ion battery, the power supply management circuit has a function for charging the battery using the voltage supplied from the external power supply. The power supply management circuit makes a comparison between the voltage supplied from the external power supply and the battery voltage, and controls which of these voltages is to be supplied to a load, based upon the comparison result.

RELATED ART DOCUMENTS

Patent Documents

[Patent Document 1]
Japanese Patent Application Laid Open No. H06-276503
[Patent Document 2]
Japanese Patent Application Laid Open No. H09-219935
[Patent Document 3]
Japanese Patent Application Laid Open No. H03-49418
[Patent Document 4]
Japanese Patent Application Laid Open No. S61-8677
[Patent Document 5]
Japanese Patent Application Laid Open No. 2009-071534

SUMMARY OF THE INVENTION

1. An embodiment of the present invention has been made in view of such a situation. Accordingly, it is an exemplary purpose of the present invention to provide, to a semiconductor apparatus to which various different kinds of devices can be connected, a method for identifying the device type of a device.

A semiconductor apparatus according to an embodiment of the present invention comprises: a signal line that connects a communication interface port via which various different kinds of devices can be connected and a communication terminal of a processor configured to perform data communication with the device; a judgment unit configured to monitor the electrical state of the signal line, and to judge the device connected to the port; and a first switch arranged between the judgment unit and the signal line. The first switch is turned on during a period in which the judgment unit judges the device, following which the first switch is turned off.

With such an embodiment, after the judgment by the judgment unit has been completed, the judgment unit is disconnected from the signal line. Thus, such an arrangement reduces the effect of the judgment unit on the data communication.

Also, a semiconductor apparatus according to an embodiment may further comprise a second switch arranged on a path of the signal line. Also, an arrangement may be made in which the second switch is turned off during a period in which the judgment unit judges the device, following which the second switch is turned on.

Such an arrangement reduces the effect of the processor on the judgment processing performed by the judgment unit when the judgment unit is in operation.

Another embodiment of the present invention also relates to a semiconductor apparatus. The semiconductor apparatus comprises: a signal line that connects a communication interface port via which various different kinds of devices can be connected and a communication terminal of a processor configured to perform data communication with the device; and a judgment unit configured to monitor the electrical state of the signal line, and to judge the device connected to the port. The judgment unit is in the active state during a period in which the judgment unit judges the device, following which the judgment unit is switched to the inactive state.

The term "inactive state" as used here represents the state in which the impedance of the judgment unit as viewed from the signal line is sufficiently high for the effect of the judgment unit on the data communication performed via the signal line to be negligibly small.

Also, a semiconductor apparatus according to an embodiment may further comprise a second switch arranged on a path of the signal line. Also, an arrangement may be made in which the second switch is turned off during a period in which the judgment unit judges the device, following which the second switch is turned on.

Also, a semiconductor apparatus according to an embodiment may further comprise a connection detection unit configured to judge whether or not a device of some kind is connected to the port. Also, the period during which the judgment unit judges the device may be set to be a predetermined time that elapses after the connection detection unit detects that the device has been connected.

Also, the port may be configured as a terminal via which a differential signal line of a USB (Universal Serial Bus) interface is connected. Also, the connection detection unit may monitor the electrical state of a second port via which a power supply line of the USB interface is connected, and may judge whether or not electrical power is being supplied via the USB interface, thereby judging whether or not a device has been connected.

Yet another embodiment of the present invention relates to an electronic apparatus. The electronic apparatus comprises: a communication interface port via which any device from among a multiplicity of different devices is connected; a processor configured to perform data communication with the connected device; and a semiconductor apparatus according to any one of the above-described embodiments, connected to the port and the processor.

Such an embodiment is capable of high-precision identification of the device type of the device. Furthermore, with such an arrangement, the data communication can be performed in a sure manner.

2. As described in Patent document 5, the power supply management circuit mounts a voltage comparison circuit configured to make a comparison between the voltage supplied from an external power supply and the battery voltage. However, with the voltage comparison circuit described in Patent document 5, current always flows through the operational amplifiers and resistors, leading to a problem of significant power consumption. It should be noted that such a problem is not restricted to a power supply management circuit. Also, such a problem can also occur in typical voltage management circuits.

An embodiment of the present invention has been made in order to solve such a problem. Accordingly, it is an exemplary purpose of an embodiment of the present invention to provide a voltage comparison circuit having an advantage of reduced power consumption.

An embodiment of the present invention relates to a voltage comparison circuit configured to compare an input voltage applied to an input terminal with a predetermined threshold voltage. The voltage comparison circuit comprises: a first voltage comparison unit configured to compare the input voltage with a predetermined first voltage, and to generate a judgment signal which is asserted when the input voltage is higher than the first threshold voltage; and a second voltage comparison unit configured such that, when the judgment signal is asserted, the second voltage comparison unit is set to the active state, and compares the input voltage with a predetermined second threshold voltage.

With such an embodiment, the second voltage comparison unit is configured to have high precision, and the first voltage comparison unit is configured to have lower precision, but instead is configured to have reduced power consumption. Thus, such an embodiment reduces the overall power consumption of the voltage comparison circuit in a situation in which the input voltage is low level.

Also, a first voltage or a second voltage that is higher than the first voltage may be applied to the input terminal. Also, the first threshold voltage may be set to a value that is higher than the first voltage.

When the first voltage is applied, such an embodiment ensures that the second voltage comparison unit is set to the inactive state. Thus, high-precision voltage comparison is performed only when the second voltage is applied, thereby detecting whether or not the second voltage is applied.

Another embodiment of the present invention relates to a power supply management circuit. The power supply management circuit comprises: a first terminal, via which an external power supply is connected; a second terminal, via which a battery is connected; a voltage comparison circuit according to any one of the above-described embodiments, configured to receive, as the input voltage, via the input terminal, a voltage applied to the first terminal from the external power supply; a selection circuit configured to select, based upon the comparison result obtained by the voltage comparison circuit, one from among the voltage output from the external power supply and the battery voltage output from the battery; and an output terminal via which the voltage selected by the selection circuit is output to an external load circuit.

Yet another embodiment of the present invention relates to an electronic device. The electronic device comprises: a battery; an adapter terminal via which an external power supply can be detachably mounted; the aforementioned power supply management circuit; and a load circuit connected to the output terminal of the power supply management circuit.

With such an embodiment, power consumption of the power supply management circuit can be reduced, thereby improving the longevity of the battery.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B.

Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

In the present specification, the symbols that denote voltage signals, current signals, and resistors, also represent the respective voltage values, current values, and resistance values, as necessary.

First Embodiment

Figure 1:
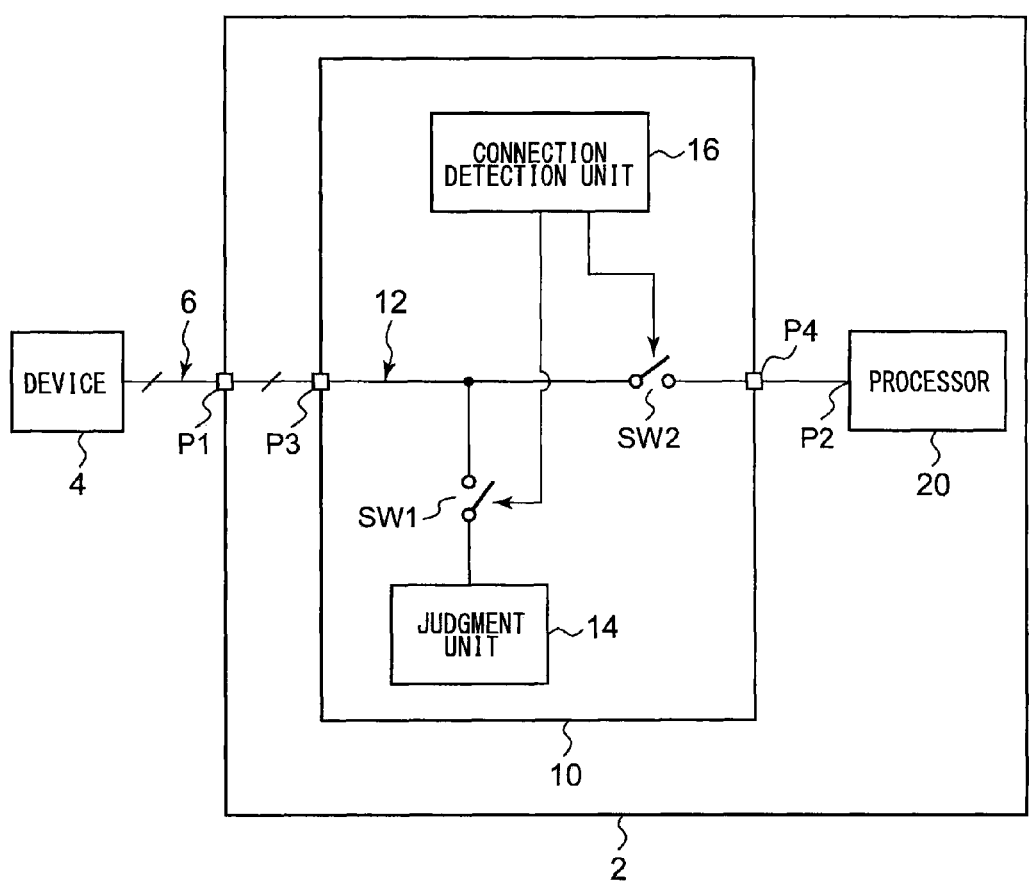
FIG. 1 is a block diagram which shows a configuration of an electronic device including a semiconductor apparatus according to a first embodiment.

FIG. 1 is a block diagram which shows a configuration of an electronic device 2 including a semiconductor apparatus 10 according to a first embodiment. The electronic device 2 includes a port (otherwise referred to as a "connector" or "terminal") P1, a semiconductor apparatus 10, and a processor 20. The port P1 is configured as a communication interface connector which enables multiple different kinds of devices to be connected.

Description will be made in the present embodiment regarding an arrangement including a USB (Universal Serial Bus) as a communication interface. However, the present invention is not restricted to such an arrangement. Rather, the present invention can be applied to the UART (Universal Asynchronous Receiver Transmitter), IEEE1397, and various kinds of interfaces for video devices and audio devices.

The USB interface provides a power supply line VBUS, a ground line GND, and a differential data line D+/D−. The port P1 shown in FIG. 1 is configured as a terminal which allows the differential line D+/D− to be connected. Although, in actuality, two ports are provided, as shown in FIG. 1, these two ports are abbreviated as the single collective port P1. An external device 4 is connected to the port P1 via a communication bus 6.

The processor 20 performs data communication with the device 4. The processor 20 may be integrated on a single semiconductor substrate together with the semiconductor apparatus 10.

The semiconductor apparatus 10 is provided between the port P1 and a communication port P2 of the processor 20. The semiconductor apparatus 10 includes a port P3, a processor-side terminal P4, a signal line 12, a judgment unit 14, and a connection detection unit 16.

The port P3 is connected to the port P1. The processor-side terminal P4 is connected to the communication terminal P2 of the processor 20.

The signal line 12 connects the port P1 (P3) and the communication terminal P2 (P4). The judgment unit 14 monitors the electrical state of the signal line 12, and judges what kind of device 4 is connected to the port P1, the state thereof, and so on.

With the present embodiment, the judgment unit 14 judges whether or not the device connected to the port P1 can supply electrical power as a power supply VBUS for the electronic device 2, i.e., whether or not the device connected to the port P1 has the capacity (1.8 A) to charge a battery (not shown) included in the electronic device 2. A device (USB charger) 4 having such a current charging capacity has an internal configuration in which the differential data line D+/D− of the communication bus 6 is short-circuited. A device which is not thus configured, i.e., a device (host or USB hub) 4 configured to perform data communication with the processor 20, has an internal configuration in which the differential data line D+/D− is pulled down via resistors. Description will be made later regarding a specific judgment method employed by the judgment unit 14.

A first switch SW1 is provided between the judgment unit 14 and the signal line 12. The first switch SW1 is turned on during a period (detection period) τDET in which the judgment unit 14 judges the device 4. Subsequently, the first switch SW1 is turned off.

A second switch SW2 is provided on the path of the signal line 12, i.e., between the device 4 and the processor 20. The second switch SW2 is turned off during the period τDET. Subsequently, the second switch SW2 is turned on.

The connection detection unit 16 judges whether or not a device of some kind has been connected to the port P1. The first switch SW1 and the second switch SW2 are each switched based upon the detection result obtained by the connection detection unit 16 of whether or not a device 4 is connected. Specifically, the detection period τDET is a period during which a predetermined time elapses after the connection detection unit 16 detects that a device 4 has been connected. The predetermined period is set to be longer than the time required by the judgment unit 14 to judge the device 4.

The connection detection unit 16 may detect whether or not a device 4 has been connected to the port 1 by mechanical means. Known techniques can be used to configure such a mechanism. Alternatively, with a preferable embodiment, the connection detection unit 16 may detect whether or not a device 4 has been connected by monitoring the electrical state of a second port (not shown) via which the power supply line VBUS of the USB interface is connected, and by judging whether or not electrical power is being supplied from the power supply VBUS via the USB interface. In a typical configuration, a circuit used to detect the VBUS is mounted on an electronic device including the USB interface. Thus, by using the detection result obtained from the VBUS detection circuit to control the first switch SW1 and the second switch SW2, such an arrangement is capable of reliably judging whether or not a device 4 has been connected. In addition, such an arrangement has the advantage that there is no need to provide an additional connection detection unit 16.

The above is the configuration of the semiconductor apparatus 10. Next, description will be made regarding the operation thereof.

In the initial state, a device 4 is not connected to the port 1, the first switch SW1 is on, and the second switch SW2 is off.

The user connects a device 4 to the port P1 via the communication bus 6. After the device 4 is connected, the connection detection unit 16 detects the device 4, and the judgment unit 14 judges the device type of the device 4. During the period used by the judgment unit 14 to make the judgment, the second switch SW2 is off. This eliminates the electrical effect of the processor 20 on the signal line 12, and thus the judgment can be made in a sure manner.

After a predetermined time elapses after the detection operation of the connection detection unit 16, the first switch SW1 is turned off, and the second switch SW2 is turned on. In a case in which the device 4 is configured as a device that communicates with the processor 20, after the second switch SW2 is turned on, a link is established between the processor 20 and the device 4, and data communication is performed between the processor 20 and the device 4. During the data communication, the first switch SW1 is off. Thus, such an arrangement is capable of eliminating the effect of the connection detection unit 16 on the data communication.

The above are the operations and the advantages of the semiconductor apparatus 10.

Figure 2:
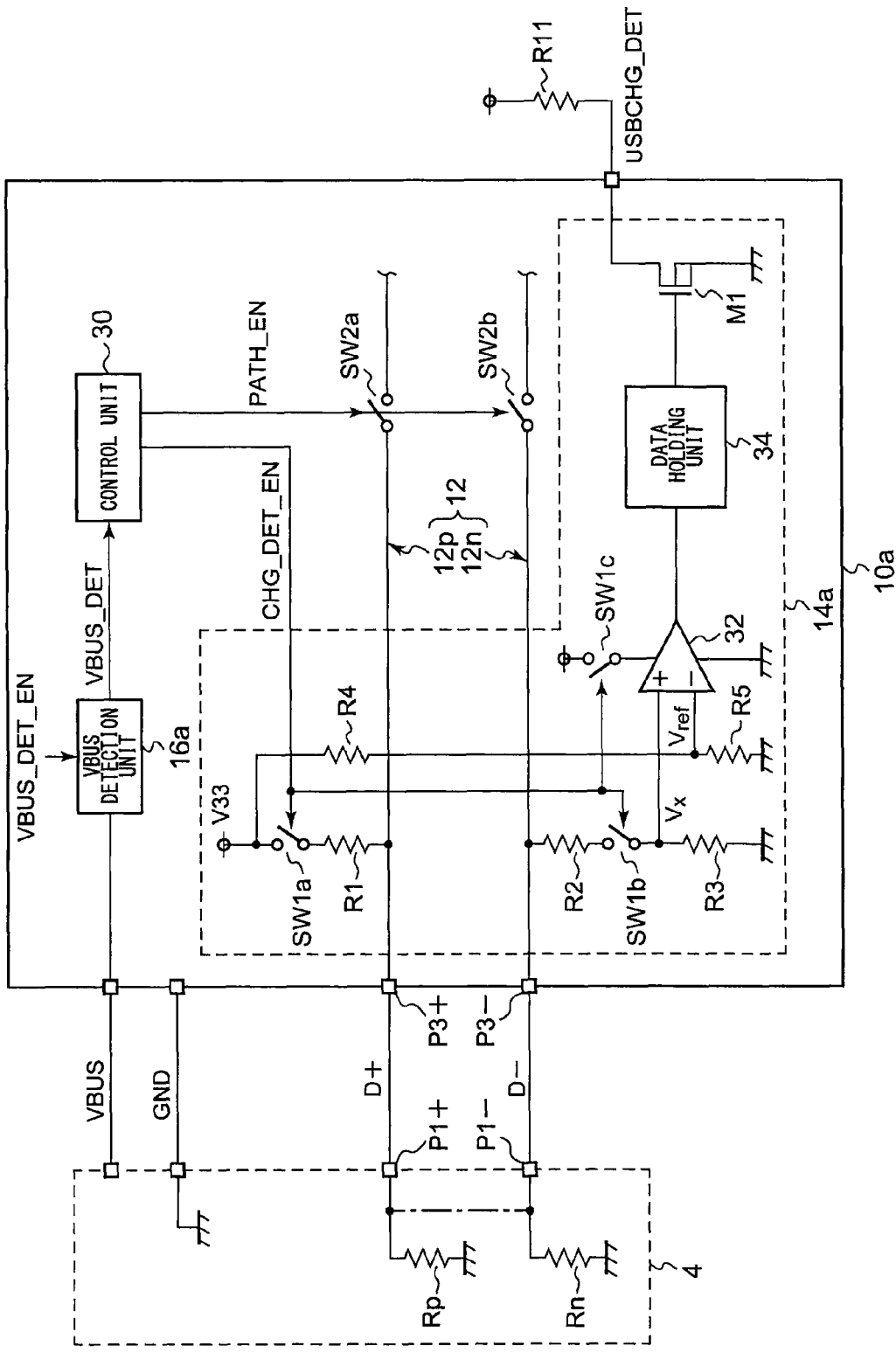
FIG. 2 is a circuit diagram which shows a configuration of a semiconductor apparatus according to the first embodiment.
Figure 3:
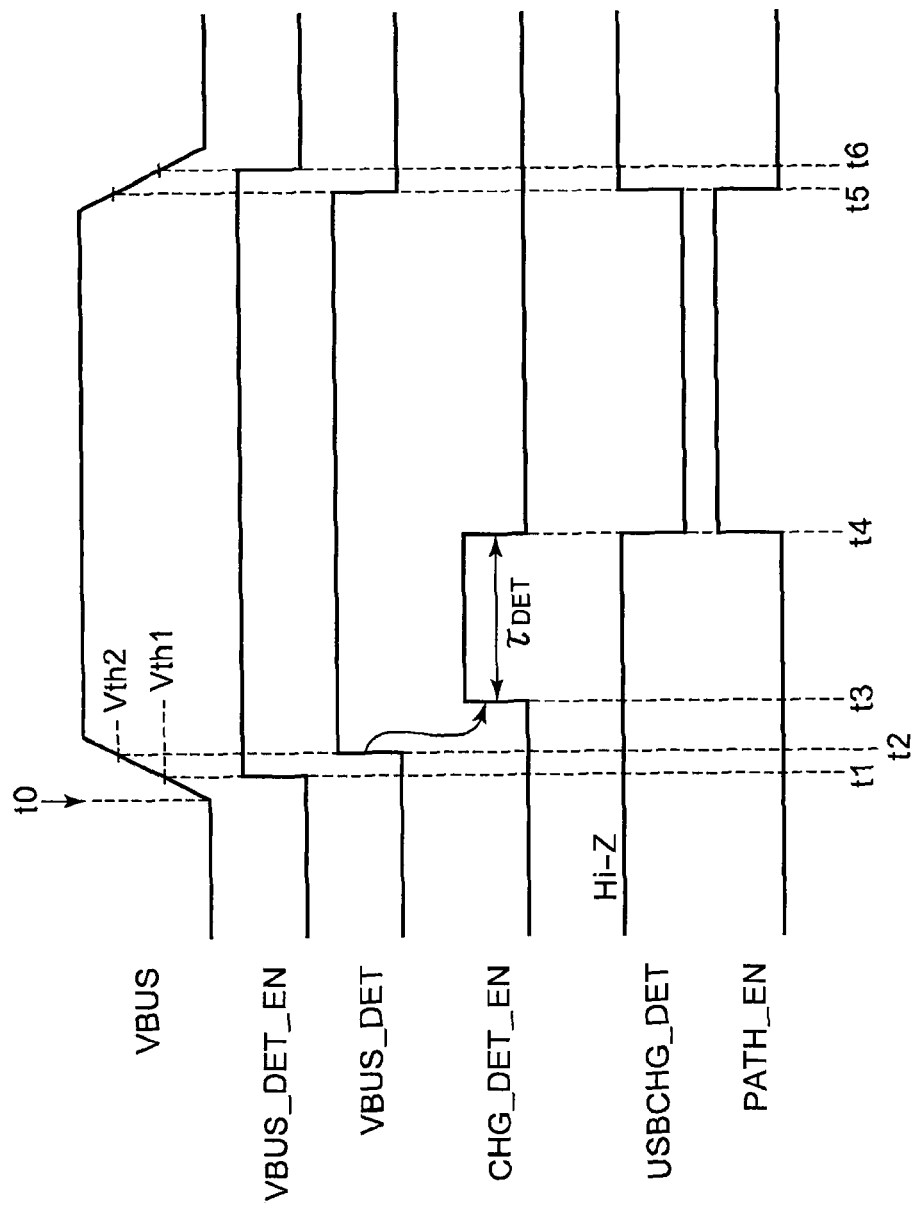
FIG. 3 is a time chart which shows the operation of the semiconductor apparatus shown in FIG. 2.

Next, description will be made regarding a specific example configuration of a semiconductor apparatus having the above-described features. FIG. 2 is a circuit diagram which shows a configuration of a semiconductor apparatus 10a according to an embodiment. The semiconductor apparatus 10a is mounted on a cellular phone terminal. With such an arrangement, the USB interface is connected to the device 4, which is configured as any one of: 1. a USB charger; 2. a USB host device, or USB hub; 3. a USB hands-free connector; or 4. USB headphones.

The semiconductor apparatus 10a includes signal lines 12p and 12n (which are collectively referred to as the "signal line 12" as necessary), a USB charger judgment unit 14a, a VBUS detection unit 16a, and a control unit 30. The USB charger judgment unit 14a and the VBUS detection unit 16a correspond to the judgment unit 14 and the connection detection unit 16 shown in FIG. 1, respectively.

When a VBUS_DET_EN signal is asserted, the VBUS detection unit 16a is switched to the active state, monitors the VBUS terminal, and compares the electric potential at the VBUS terminal with a predetermined voltage Vth. When the comparison result is VBUS>Vth, the VBUS detection unit 16a asserts the VBUS detection signal (VBUS_DET signal).

The control unit 30 receives the VBUS_DET signal. When the VBUS_DET signal is asserted, the control unit 30 asserts a startup signal (CHG_DET_EN signal) after 2.6 ms elapses. The CHG_DET_EN signal is asserted for a predetermined time (20 ms), following which the CHG_DET_EN signal is negated.

The USB charger judgment unit 14a monitors the electrical state of the signal line 12 so as to judge the device type of the device 4. The USB charger judgment unit 14a is configured such that it can be switched between an active state and an inactive state. The USB charger judgment unit 14a is set to the active state during a period in which the CHG_DET_EN signal is asserted. In the inactive state, the impedance of the USB charger judgment unit 14a as viewed from the signal line 12 is very high. In other words, such an arrangement is configured such that, in the inactive state, the USB charger judgment unit 14a has essentially no effect on the signal line 12. It can also be understood that the first switch SW1 shown in FIG. 1 is configured as a switch which switches the judgment unit 14 between the active state and the inactive state.

After the CHG_DET_EN signal is negated, the control unit 30 asserts a path enable signal (PATH_EN signal). When the PATH_EN signal is asserted, the second switches SW2a and SW2b are turned on.

Next, description will be made regarding the configuration of the USB charger judgment unit 14a. The USB charger judgment unit 14a includes first switches SW1a through SW1c, a first resistor R1 through a fifth resistor R5, a comparator 32, a data holding unit 34, and a transistor M1. It should be noted that the first switches SW1a and SW1b correspond to the first switch SW1 shown in FIG. 1.

When the startup signal CHG_DET_EN is asserted, the first switches SW1a through SW1c are turned on. The signal line 12p is pulled up to a predetermined voltage V33 via the first resistor R1 and the first switch SW1a. The second resistor R2, the first switch SW1b, and the third resistor R3 are connected in series between the signal line 12n and the ground terminal. The voltage at the signal line 12n is divided by means of the second resistor R2 and the third resistor R3, and the voltage Vx thus divided is input to the non-inverting input terminal of the comparator 32.

The predetermined voltage V33 is divided by means of the fourth resistor R4 and the fifth resistor R5, and the voltage Vref thus divided is applied to the inverting input terminal of the comparator 32. The first switch SW1c is arranged on the power supply path of the comparator 32.

The data holding unit 34 holds the output signal of the comparator 32. When the VBUS_DET signal is negated, the comparator 32 is released from the hold state. The drain of the transistor M1 is pulled up via the resistor R11, and the value held by the data holding unit 34 is thereby output in an open drain configuration.

The above is the configuration of the semiconductor apparatus 10a. Next, description will be made regarding the operation thereof. At the time point t0, the device 4 is mounted via a USB cable. In this state, the bus voltage VBUS rises.

When the bus voltage VBUS exceeds a first threshold voltage Vth1 (=2.5 V) at the time point t1, the VBUS_DET_EN signal is asserted (set to high level), thereby setting the VBUS detection unit 16a to the active state. The VBUS_DET_EN signal is generated by an unshown circuit. The VBUS detection unit 16a compares the bus voltage VBUS with a threshold voltage Vth2 (=3.2 V). When VBUS exceeds Vth2 (at the time point t2), the VBUS detection unit 16a asserts (sets to high level) the VBUS_DET signal. When the VBUS_DET signal is asserted, the control unit 30 asserts (sets to high level) the CHG_DET_ EN signal for a predetermined detection period τDET from the time point t3 to the time point t4. When the CHG_DET_EN signal is asserted, the USB charger judgment unit 14a is set to the active state. When the USB charger judgment unit 14a is in the active state, the first switches SW1a through SW1b are turned on.

(1) A Case in which the Device 4 is a USB Charger.

In this case, a voltage on the order of 4 to 5.3 V is supplied as the bus voltage VBUS. Furthermore, the differential data line D+/D− of the communication bus 6 is short-circuited, i.e., the ports P1+ and P1− are short-circuited (indicated by the line of dashes and dots in FIG. 2).

When the first switch SW1a is turned on, the electric potential at the signal line 12p is pulled up to high level (V33). In the device 4, the ports P1+ and P1− are short-circuited, and accordingly, the electric potential at the signal line 12n is also pulled up to high level (V33). As a result, the relation VX>Vref is satisfied. Thus, the signal output from the comparator 32 is high level.

The data holding unit 34 holds the output signal level of the comparator 32 for at least a period from the time point t4 to the time point t5. During this period, the USBCHG_DET signal, which indicates that a USB charger has been detected, is maintained at low level.

After the detection of the USB charger, when the device 4 is detached, and the bus voltage VBUS accordingly becomes lower than the threshold voltage Vth2 at the time point t5, the VBUS_DET signal is negated. When the negated VBUS_DET signal is detected, the data holding unit 34 is released from the holding state.

Furthermore, during a period after the detection period τSET elapses, from the time point t4 to the time point t5, the PATH_EN signal is asserted, which turns on the second switches SW2a and SW2b. It should be noted that an arrangement may be made in which, in a case in which a USB charger is connected as the device 4, the second switches SW2a and SW2b remain turned off. This is because the processor does not need to perform data communication with the device 4 in this case.

(2) A Case in which a Host or USB Hub is Connected.

In this case, a voltage on the order of 4 to 5.3 V is supplied as the bus voltage VBUS. Furthermore, in the device 4, both sides of the differential data line D+/D− of the communication bus 6, i.e., the respective ports P1+ and P−, are each pulled down (indicated by the solid line in FIG. 2).

In this case, the signal line 12n is pulled down, and accordingly, the voltage Vx is set to low level. As a result, Vx is lower than Vref, and accordingly, the output signal of the comparator 32 is low level. In this stage, the USB_CHG_DET is set to the high impedance state.

Furthermore, after the detection period τSET elapses, during a period from the time point t4 to the time point t5, the PATH_EN signal is asserted, which turns on the second switches SW2a and SW2b. In this state, a link is established between an unshown processor 20 and the device 4, following which data communication is initiated.

(3) A Case in which a USB Hands-Free Unit is Connected.

In this case, the same operation is executed as that executed in (2), in a case in which a host is connected.

(4) A Case in which Headphones are Connected.

In this case, the bus voltage VBUS is biased on the order of 1.7 V to 1.92 V. In this state, VBUS is smaller than Vth1, and accordingly, the respective units included in the semiconductor apparatus 10a do not operate, and the USBCHG_DET signal is thereby set to the high impedance state. An unshown different circuit judges whether the headphones are stereo or monaural.

The above is the operation of the semiconductor apparatus 10a. With the semiconductor apparatus 10 shown in FIG. 1 or the semiconductor apparatus 10a shown in FIG. 2, the judgment unit 14 (14a) configured to judge the device type of the device 4 can be disconnected from the signal line 12, thereby reducing the effect of the judgment unit 14 (14a) on the data communication. Conversely, in the judgment step, the processor 20 can be disconnected from the signal line 12, thereby reducing the effect of the processor 20 on the device type judgment performed by the judgment unit 14.

Description has been made regarding an arrangement according to the present invention with reference to the first embodiment. The above-described embodiments have been described for exemplary purposes only, and are by no means intended to be interpreted restrictively. Rather, various modifications may be made to the aforementioned components, processes, and combinations thereof. Description will be made below regarding such modifications.

The semiconductor apparatus 10 shown in FIG. 1 is not restricted to such an application shown in FIG. 2. Rather, the semiconductor apparatus 10 shown in FIG. 1 can be applied to various interface standards.

Second Embodiment

Figure 4:
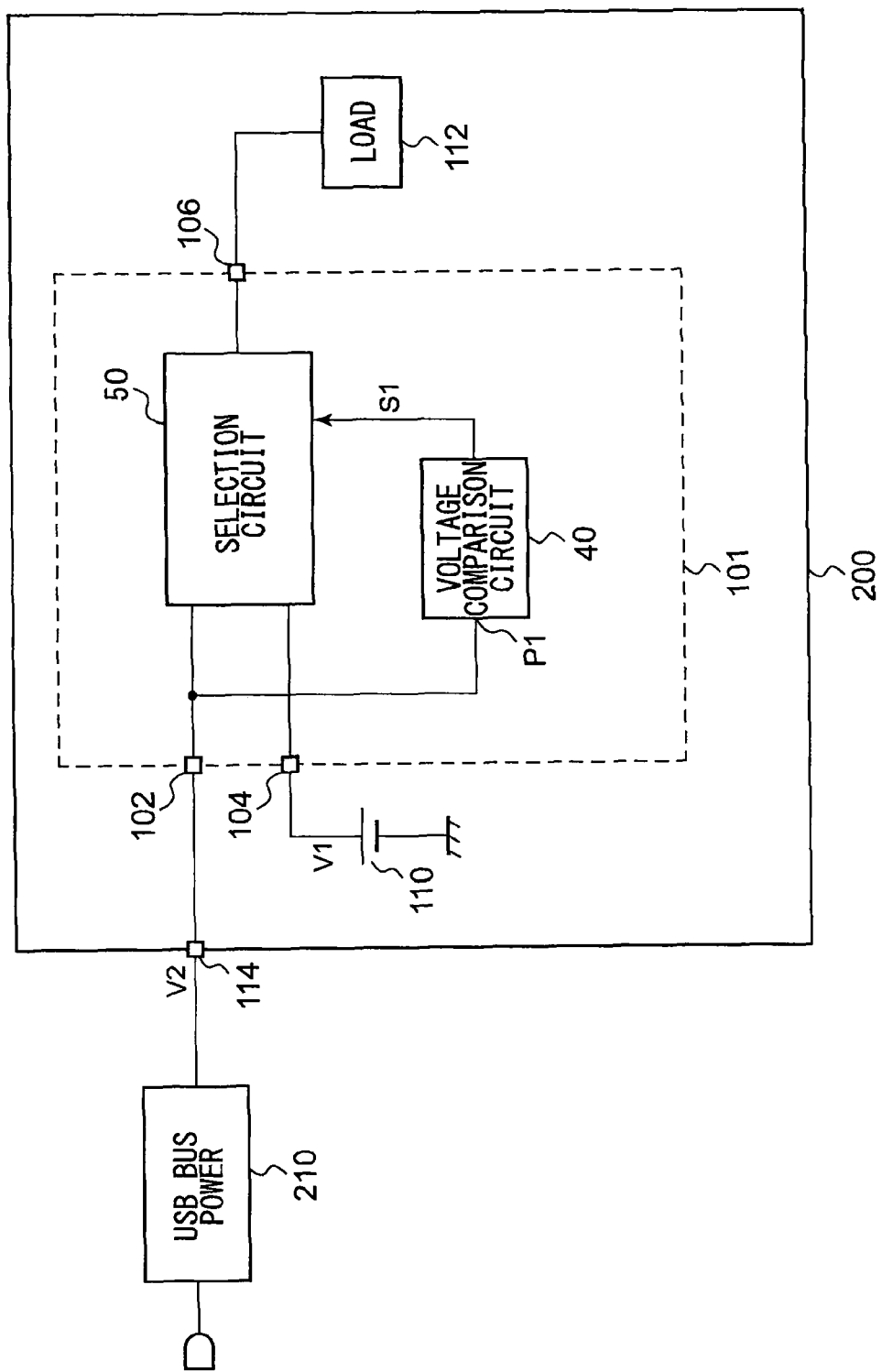
FIG. 4 is a block diagram which shows a configuration of an electronic device including a power supply management circuit according to an embodiment.

FIG. 4 is a block diagram which shows a configuration of an electronic device 200 including a power supply management circuit 101 according to a second embodiment. The electronic device 200 is configured as a battery-driven information terminal device such as a cellular phone terminal, a PDA, a laptop PC, or the like, for example. The electronic device 200 includes a power supply management circuit 101, a battery 110, a load 112, and an adapter terminal 114.

The battery 110 is configured as a rechargeable battery such as a lithium-ion battery, a nickel hydride battery, or the like, and outputs a battery voltage V1 (=Vbat). The adapter terminal 114 is configured as a terminal which allows an external power supply 210 to be detachably mounted. The voltage V2 (which will be referred to as the "external voltage" hereafter) output from the external power supply 210 is received via the adapter terminal 114. The power supply management circuit 101 receives the external voltage V2 and the battery voltage V1, and selects either one of these voltages. The power supply management circuit 101 supplies the voltage thus selected to the load 112, and charges the battery 110 using the external voltage V2. Examples of the load 112 include power supply circuits, DSPs, liquid crystal panels, and other kinds of analog circuits and digital circuits, which are not shown. The external power supply 210 is USB (Universal Serial Bus) bus power or an AC adapter configured to convert commercial AC voltage into DC voltage. Description will be made below regarding an arrangement including USB bus power. That is to say, the external voltage V2 is a voltage that corresponds to the bus voltage VBUS stipulated by the USB standard.

The power supply management circuit 101 includes an external voltage detection circuit (which will also be referred to as the "voltage comparison circuit") 40, a selection circuit 50, and a charge control unit (not shown), and is integrated in the form of a function IC formed on a semiconductor substrate. The power supply management circuit 101 receives the external voltage V2 via the adapter terminal 102, and receives the battery voltage V1 via the battery terminal 104. The output terminal 106 is connected to the load 112. The adapter terminal 102 is connected to the VBUS terminal of a USB cable. That is to say, upon connecting the USB cable to the adapter terminal 102, the electric power VBUS (=V2) is supplied to the adapter terminal.

The external voltage detection circuit 40 judges whether or not the external voltage V2 is supplied, or whether or not the external voltage V2 has a voltage level sufficient to drive the load 112. When judgment has been made that a sufficient external voltage V2 is supplied, the external voltage detection circuit 40 asserts (sets to high level) a detection signal S1. Specifically, the external voltage detection circuit 40 compares the external voltage V2 input via the input terminal P1 with a predetermined threshold voltage (second threshold voltage Vth2 described later), and generates the detection signal S1 which represents the comparison result. The power supply management circuit 101 monitors the detection signal S1. The operation mode of the power supply management circuit 101 is switched based upon whether or not the bus voltage VBUS is supplied.

For example, the selection circuit 50 receives the comparison result obtained by the voltage comparison circuit 40, i.e., the control signal (which will also be referred to as the "VBUS detection signal") S1. When the detection signal S1 is asserted (set to high level), the selection circuit 50 selects the external voltage V2, and when the detection signal S1 is negated (set to low level), the selection circuit 50 selects the battery voltage V1. The configuration of the selection circuit 50 is not restricted in particular.

The voltage comparison circuit according to the present embodiment can be suitably applied to the external voltage detection circuit 40 configured to perform the voltage comparison processing. Description will be made below regarding the configuration of the voltage comparison circuit 40.

Figure 5:
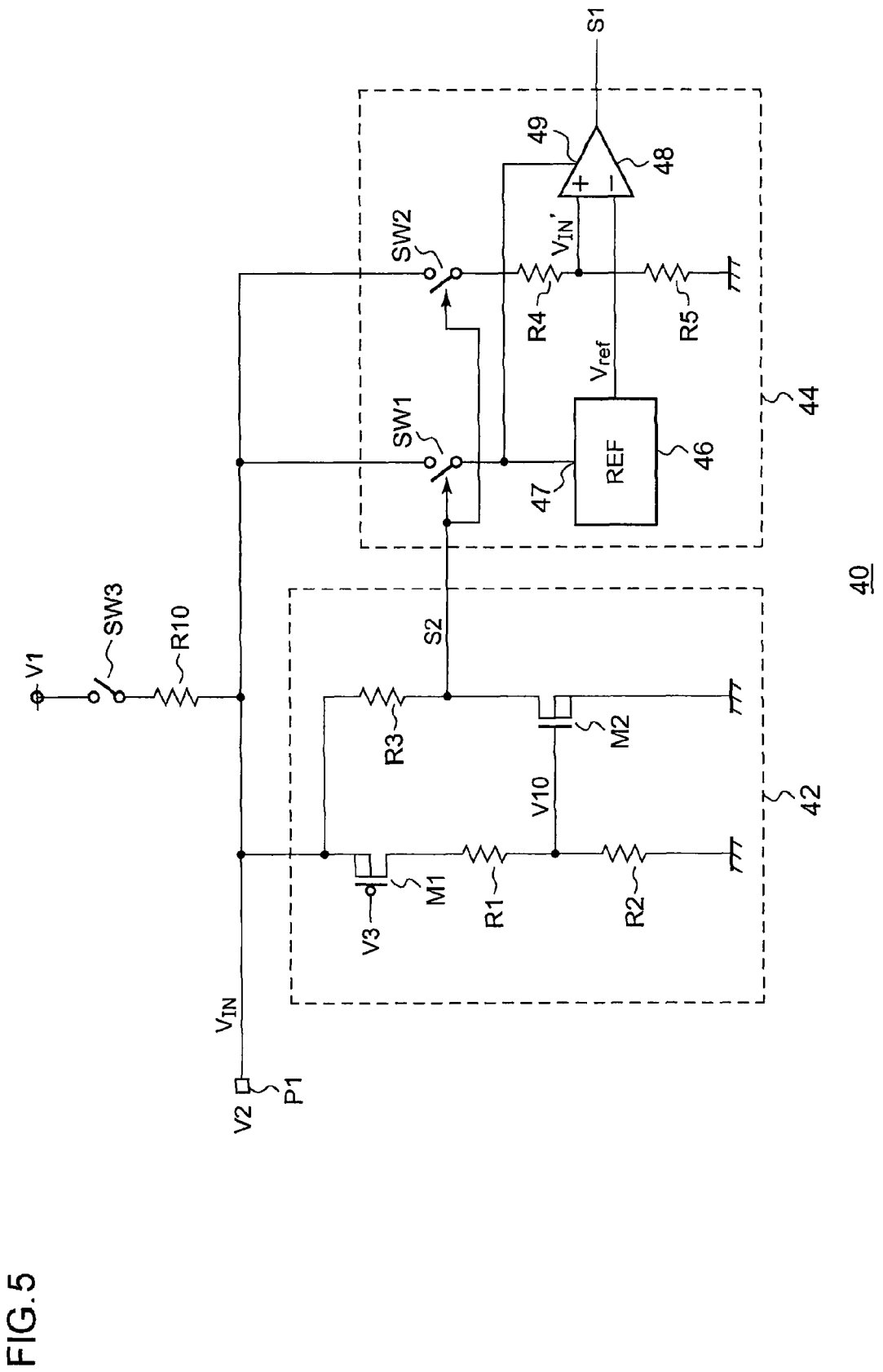
FIG. 5 is a circuit diagram which shows a configuration of a voltage comparison circuit according to an embodiment.

FIG. 5 is a circuit diagram which shows a configuration of a voltage comparison circuit (external voltage detection circuit) 40 according to a second embodiment. Also, the voltage comparison circuit 40 shown in FIG. 5 can be employed as the VBUS detection unit 16a shown in FIG. 2. In this case, the detection signal S1 corresponds to the signal VBUS_DET shown in FIG. 2.

The voltage detection circuit 40 compares the input voltage VIN applied to the input terminal P1 with a predetermined threshold voltage. When the external power supply 210 is connected to the input terminal P1, the input voltage VIN is equal to the external voltage V2. The battery voltage V1 is applied to the input terminal P1 via a pull-up resistor R10 and a switch SW3. When the switch SW3 is on, the input voltage VIN is equal to the battery voltage V1. In a case in which a connector is not connected to the adapter terminal 114 shown in FIG. 4, the switch SW3 is switched on. Whether or not a connector is connected is judged by means of an unshown different block.

That is to say, the input voltage VIN applied to the input terminal P1 is set to either the battery voltage V1 or the external voltage V2. Between the external voltage V2 and the battery voltage V1, the relation V2>V1 is satisfied. For example, the battery voltage V1 is on the order of 3.5 V to 4.2 V, and the external voltage V2 (=VBUS) is on the order of 5 V.

The voltage comparison circuit 40 includes a first voltage comparison unit 42 and a second voltage comparison unit 44. The first voltage comparison unit 42 compares the input voltage VIN with a predetermined first threshold voltage Vth1. The first voltage comparison unit 42 generates a judgment signal S2 which is asserted when the input voltage VIN is higher than the first threshold voltage Vth1. Here, the first threshold voltage Vth1 is preferably set to be higher than a voltage that is assumed to be the battery voltage V1.

The second voltage comparison unit 44 is configured such that it can be switched between the active state and the inactive state. In the inactive state, the power consumption of the second voltage comparison unit 44 is essentially zero. The power consumption of the first voltage comparison unit 42 is at least smaller than the power consumption of the second voltage comparison unit 44 in the active state.

When the judgment signal S2 is asserted, the second voltage comparison unit 44 is switched to the active state. In the active state, the second voltage comparison unit 44 compares the input voltage Vin with a predetermined second threshold voltage Vth2. As a result of the comparison, when VIN>Vth2, the second voltage comparison unit 44 asserts (sets to high level) the detection signal S1, and when VIN<Vth2, the second voltage comparison unit 44 negates (set to low level) the detection signal S1.

As described later, the second voltage comparison unit 44 is configured such that the power consumption thereof in the inactive state is essentially zero, or is very low.

Next, description will be made regarding a specific example configuration of the first voltage comparison unit 42. The first voltage comparison unit 42 includes a first transistor M1, a second transistor M2, a first resistor R1, a second resistor R2, and a third resistor R3.

The first transistor M1 is configured as a P-channel MOSFET. A predetermined voltage V3 is input to the gate of the first transistor M1, and the source thereof is connected to the input terminal P1.

The first resistor R1 and the second resistor R2, which function as impedance elements, are connected in series between the drain of the first transistor M1 and the ground terminal. The drain voltage of the first transistor M1 is divided by means of the first resistor R1 and the second resistor R2. The second transistor M2 is configured as an N-channel MOSFET. The output voltage V10 of the dividing circuit (R1, R2) is applied to the gate of the second transistor M2. The source of the second transistor M2 is grounded, and thus, the electric potential of the source is fixed. The third resistor R3 is arranged between the drain of the second transistor M2 and the input terminal P1.

Next, description will be made regarding the operation of the first voltage comparison unit 42. The gate-source threshold voltages of the first transistor M1 and the second transistor M2 are represented by Vthp and Vthn, respectively.

(1) A Case in which VIN<V3+Vthp.

In this case, the first transistor M1 is off. When the first transistor M1 is off, the drain voltage is 0 V, and the output voltage V10 of the dividing circuit is also 0 V. In this state, the second transistor M2 is off, thereby setting the judgment signal S2 to high level (negated).

With such an arrangement, it should be noted that, when VIN<V3+Vthp, the first transistor M1 and the second transistor M2 are each off, and accordingly, there is no effective current path for the first voltage comparison unit 42. Thus, in this state, the power consumption of the first voltage comparison unit 42 is essentially zero. Also, it should be noted that the first voltage comparison unit 42 uses the gate threshold voltage of the MOSFET, and to that extent does not provide high-precision voltage comparison.

(2) A Case in which VIN>V1+Vthp.

In this case, the first transistor M1 is on. In this state, the output voltage V10 of the dividing circuit (R1, R2) is represented by V10=VIN×R2/(R1+R2), thereby switching on the second transistor M2. As a result, the judgment signal S2 is set to low level (asserted).

That is to say, the first voltage comparison unit 42 outputs the judgment signal S2 according to the ON/OFF operation of the first transistor M1. With such an arrangement, the right side (V3+Vthp) of the Expression VIN>V3+Vthp corresponds to the aforementioned first threshold voltage Vth1. The predetermined voltage V3 should be determined such that (V3+Vthp) is higher than the battery voltage V1. For example, if the battery voltage V1 itself is employed as the voltage V3, it naturally satisfies the relation V3+Vthp>V1. It should be noted that other voltages that differ from the battery voltage V1 may be employed as the voltage V3.

It should be noted that, according to the combination of the first resistor R1 and the second resistor R2, two threshold voltages can be set for the first voltage comparison unit 42.

That is to say, in order to set the judgment signal S2 to low level (asserted), the following expressions must be satisfied.

$$VIN > V3 + Vthp \tag{1}$$

$$VIN \times R2/(R1+R2) > Vthn \tag{2}$$

Here, Expression (2) is transformed, thereby obtaining the following Expression (2)'.

$$VIN > (R1+R2)/R2 \times Vthn \tag{2'}$$

Accordingly, the first threshold voltage Vth1 set for the first voltage comparison unit 42 can be regarded as being represented by the higher of the two voltages represented by the following Expressions.

$$(V3+Vthp) \tag{a}$$

$$(R1+R2)/(R2 \times Vthn) \tag{b}$$

Next, description will be made regarding a specific example configuration of the second voltage comparison unit 44.

The second voltage comparison unit 44 includes a reference voltage source 46, a comparator 48, a fourth resistor R4, a fifth resistor R5, a first switch SW1, and a second switch SW2.

The comparator 48 receives, via the first terminal (non-inverting input terminal) thereof, the voltage VIN' that corresponds to the input voltage VIN. Furthermore, the comparator 48 receives a predetermined reference voltage Vref via the second terminal (inverting input terminal) thereof. With such an arrangement, the comparator 48 compares the voltage VIN' with the reference voltage Vref. In FIG. 5, the input voltage VIN is divided by means of the fourth resistor R4 and the fifth resistor R5, thereby generating the voltage VIN'. The second switch SW2 is arranged between the fourth resistor R4 and the input terminal P1. When the judgment signal S2 is asserted, the second switch SW2 is switched on, and when the judgment signal S2 is negated, the second switch SW2 is switched off.

The first switch SW1 is arranged between a power supply terminal 49 of the comparator 48 and the input terminal P1. When the judgment signal S2 is asserted, the first switch SW1 is switched on, and when the judgment signal S2 is negated, the first switch SW1 is switched off.

The reference voltage source 46 receives the input voltage VIN via the power supply terminal thereof. The reference voltage source 46 generates the reference voltage Vref. The reference voltage source 46 may be configured as a band-gap regulator. Also, the reference voltage source 46 may generate the reference voltage Vref using the battery voltage V1. The configuration of the reference voltage source 46 is not restricted in particular. The first switch SW1 is arranged between the power supply terminal 47 of the reference voltage source 46 and the input terminal P1.

Next, description will be made regarding the operation of the second voltage comparison unit 44.

When the judgment signal S2 is negated, the first switch SW1 is set to OFF state. Accordingly, electrical power is not supplied to the reference voltage source 46 and the comparator 48. Thus, in this state, power consumption of the reference voltage source 46 and the comparator 48 is essentially zero. Furthermore, in this state, the second switch SW2 is off, and accordingly, the current that flows through the fourth resistor R4 and the fifth resistor R5 is cut off, thereby reducing the power consumption. It should be noted that, in a case in which the impedances of the fourth resistor R4 and the fifth resistor R5 are sufficiently high, the second switch SW2 may be eliminated.

When the judgment signal S2 is asserted, the first switch SW1 and the second switch SW2 are each switched on. In this state, the comparator 48 compares the input voltage VIN' with the reference voltage Vref.

With such an arrangement, when VIN×R5/(R4+R5)>Vref, the detection signal S1 is asserted (set to high level). Conversely, when VIN×R5/(R4+R5)<Vref, the detection signal S1 is negated (set to low level).

That is to say, Vref×(R4+R5)/R5 corresponds to the aforementioned second threshold voltage Vth2. The second voltage comparison unit 44 employs the comparator 48. Thus, the precision of the voltage comparison provided by the second voltage comparison unit 44 is higher than that provided by the first voltage comparison unit 42.

The above is the configuration of the voltage comparison circuit 40. Next, description will be made regarding the overall operation of the voltage comparison circuit 40.

(1) A Case in which the External Voltage V2 is not Supplied.

In this case, when the switch SW3 is turned on, the input voltage VIN at the input terminal P1 is pulled up to the battery voltage V1. In this state, the input voltage VIN (=V1) is lower than the first threshold voltage Vth1, and accordingly, the judgment signal S2 remains negated. As a result, the second voltage comparison unit 44 is in the inactive state. When the second voltage comparison unit 44 is inactive, the detection signal S1 is low level (negated).

In this state, the power consumption of both the first voltage comparison unit 42 and the second voltage comparison unit 44 are suppressed to zero.

(2) A Case in which the External Voltage V2 is Supplied.

In this case, the switch SW3 is switched to off, and accordingly, the input voltage VIN at the input terminal P1 is equal to the external voltage V2. With such an arrangement, when the input voltage VIN (=V12) is higher than the first threshold voltage Vth1, the judgment signal S2 is asserted. In this state, high-precision voltage comparison is made by means of the second voltage comparison unit 44.

In this step, if the second voltage comparison unit 44 has judged that V2 is lower than Vth2, the detection signal S1 is negated. When the detection signal S1 is negated, the selection circuit 50 shown in FIG. 4 selects the battery voltage V1, and supplies the battery voltage V1 thus selected to the load 112.

Conversely, if it has been judged that V2 is higher than Vth2, the detection signal S1 is asserted. When the detection signal S1 is asserted, the selection circuit 50 shown in FIG. 4 selects the external voltage V2, and supplies the external voltage V2 thus selected to the load 112.

The above are the operations of the power supply management circuit 101. In summary, first, the voltage comparison circuit 40 compares the input voltage VIN with the first threshold voltage Vth1 by means of the first voltage comparison unit 42, which trades off low comparison precision for low power consumption. With such an arrangement, when the relation VIN>Vth1 is satisfied, the second voltage comparison unit 44, which is capable of high-precision voltage comparison, compares the input voltage VIN with the second threshold voltage Vth2.

With conventional arrangements, the voltage that corresponds to the input voltage VIN is compared with a predetermined threshold voltage (the voltage that corresponds to the second threshold voltage Vth2 according to the embodiment) only by means of a comparator, and the selection circuit 50 is controlled based upon the comparison result. Accordingly, the comparator operates even in a situation in which the external voltage V2 is not supplied, leading to significant power consumption.

In contrast, the voltage comparison circuit 40 shown in FIG. 5 allows the overall power consumption to be reduced in a situation in which the external voltage V2 is not supplied, or in a situation in which the external voltage V2 is supplied and the level thereof is very low.

Description has been made regarding the present invention with reference to the embodiment. The above-described embodiment has been described for exemplary purposes only, and is by no means intended to be interpreted restrictively. Rather, various modifications may be made by making various combinations of the aforementioned components or processes. Description will be made below regarding such modifications.

Figure 6:
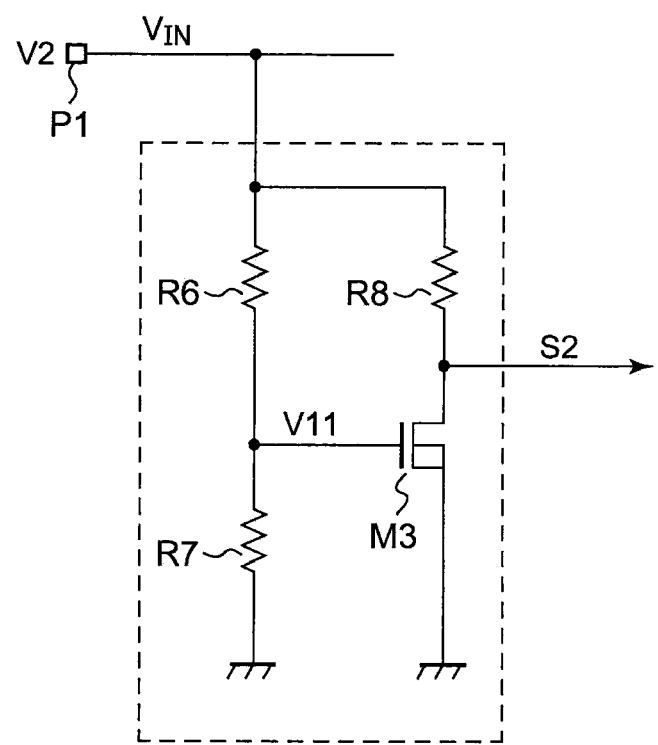
FIG. 6 is a circuit diagram which shows another example configuration of a first voltage comparison unit.

FIG. 6 is a circuit diagram which shows another example configuration of the first voltage comparison unit. The first voltage comparison unit 42a includes a sixth resistor R6 through an eighth resistor R8, and a third transistor M3. The sixth resistor R6 and the seventh resistor R7 function as a dividing circuit, which divides the input voltage VIN. The third transistor M3 is configured as an N-channel MOSFET. The source of the third transistor M3 is grounded, and accordingly, the electric potential at the source of the third transistor M3 is fixed. An input voltage V11 (=VIN×(R7)/(R6+R7)) obtained by dividing the input voltage VIN is input to the gate of the third transistor M3. The eighth resistor R8 is arranged between the input terminal P1 and the drain of the third transistor M3.

Next, description will be made regarding the operation of the first voltage comparison unit 42a. The gate-source threshold voltage of the third transistor M3 will be represented by Vthn.

When the relation VIN×(R7)/(R6+R7)<Vthn is satisfied, the third transistor M3 is off, and accordingly, the judgment signal S2 is negated (set to high level).

Conversely, when the relation VIN×(R7)/(R6+R7)>Vthn is satisfied, the third transistor M3 is on, and accordingly, the judgment signal S2 is asserted (set to low level).

That is to say, Vthn×(R6+R7)/R7 corresponds to the aforementioned first threshold voltage Vth1.

In contrast with the first voltage comparison unit 42 shown in FIG. 5, the first voltage comparison unit 42a shown in FIG. 6 does not need to receive the predetermined voltage (reference voltage) V3. Thus, the first voltage comparison unit 42a shown in FIG. 6 can be suitably applied to an arrangement in which there are no voltages available other than the input voltage VIN. However, a current always flows through a path of the sixth resistor R6 and the seventh resistor R7. Accordingly, the first voltage comparison unit 42a shown in FIG. 6 is inferior to the first voltage comparison unit 42 shown in FIG. 5 from the point of view of power consumption. However, by means of the resistance values of the sixth resistor R6 and the seventh resistor R7 being sufficiently high, the power consumption of the first voltage comparison unit 42a can be made to approach essentially zero.

Description has been made in the embodiment regarding an arrangement in which the voltage comparison circuit 40 is employed as a detection circuit configured to detect whether or not the external voltage V2 (the USB bus voltage VBUS) is supplied. However, the application of the voltage comparison circuit 40 is not restricted to such an arrangement. Rather, the voltage comparison circuit 40 can be applied to various uses in which a given voltage is compared with a threshold voltage.

While the preferred embodiments of the present invention have been described using specific terms, such description is for illustrative purposes only, and it is to be understood that changes and variations may be made without departing from the spirit or scope of the appended claims.

What is claimed is:

1. A semiconductor apparatus comprising:
a communication interface port connected to a device;
a communication terminal connected to a processor;
a signal line that connects the communication interface port and the communication terminal;
a judgment unit configured to monitor the electrical state of the signal line, and to judge a device type of the device connected to the port;
a first switch arranged between the judgment unit and the signal line;
a second switch arranged on a path of the signal line; and
a controller arranged to turn on the first switch and turns off the second switch during a period in which the judgment unit judges a device type of the device.

2. A semiconductor apparatus according to claim 1, wherein the controller turns off the second switch during a period in which the judgment unit judges a device type of the device, following which the controller turns on the second switch.

3. A semiconductor apparatus according to claim 2, further comprising a connection detection unit configured to judge whether or not a device of some kind is connected to the port, and wherein the period during which the judgment unit judges a device type of the device is set to be a predetermined time that elapses after the connection detection unit detects that the device has been connected.

4. A semiconductor apparatus according to claim 3, wherein the port is configured as a terminal via which a differential signal line of a USB (Universal Serial Bus) interface is connected,
and wherein the connection detection unit monitors the electrical state of a second port via which a power supply line of the USB interface is connected, and judges whether or not electrical power is being supplied via the USB interface, thereby judging whether or not a device has been connected.

5. A semiconductor apparatus according to claim 4, wherein the connection detection unit includes a voltage comparison circuit configured to compare an input voltage applied to the second port with a predetermined threshold voltage,
and wherein the voltage comparison circuit comprises:
a first voltage comparison unit configured to compare the input voltage with a predetermined first threshold voltage, and to generate a judgment signal which is asserted when the input voltage is higher than the first threshold voltage; and
a second voltage comparison unit configured such that, when the judgment signal is asserted, the second voltage comparison unit is switched to the active state, and compares the input voltage with a predetermined second threshold voltage.

6. An electronic device comprising:
a communication interface port via which any device from among a multiplicity of different devices is connected;
a processor configured to perform data communication with the device; and
a semiconductor apparatus according to claim 1, connected to the port and the processor.

7. A semiconductor apparatus comprising:
a communication interface port connected to a device;
a communication terminal connected to a processor;
a signal line that connects the communication interface port and the communication terminal;
a judgment unit configured to monitor the electrical state of the signal line, and to judge a device type of the device connected to the port;
a first switch arranged between the judgment unit and the signal line;
a second switch arranged on a path of the signal line; and
a controller arranged to turn on/off the first switch and the second switch,
wherein the judgment unit is in the active state during a period in which the judgment unit judges a device type of the device, following which the judgment unit is switched to the inactive state,
and wherein the controller is configured to turn on the first switch and to turn off the second switch during a period in which the judgment unit judges a device type of the device.

8. A semiconductor apparatus according to claim 7, wherein the controller turns off the second switch during a period in which the judgment unit judges a device type of the device, following which the controller turns on the second switch.

9. A semiconductor apparatus according to claim 8, further comprising a connection detection unit configured to judge whether or not a device of some kind is connected to the port, and wherein the period during which the judgment unit judges a device type of the device is set to be a predetermined time that elapses after the connection detection unit detects that the device has been connected.

10. A semiconductor apparatus according to claim 9, wherein the port is configured as a terminal via which a differential signal line of a USB (Universal Serial Bus) interface is connected,
and wherein the connection detection unit monitors the electrical state of a second port via which a power supply line of the USB interface is connected, and judges whether or not electrical power is being supplied via the USB interface, thereby judging whether or not a device has been connected.

11. A semiconductor apparatus according to claim 10, wherein the connection detection unit includes a voltage comparison circuit configured to compare an input voltage applied to the second port with a predetermined threshold voltage, and wherein the voltage comparison circuit comprises:
- a first voltage comparison unit configured to compare the input voltage with a predetermined first threshold voltage, and to generate a judgment signal which is asserted when the input voltage is higher than the first threshold voltage; and
- a second voltage comparison unit configured such that, when the judgment signal is asserted, the second voltage comparison unit is switched to the active state, and compares the input voltage with a predetermined second threshold voltage.

12. An electronic device comprising:
a communication interface port via which any device from among a multiplicity of different devices is connected;
a processor configured to perform data communication with the device; and
a semiconductor apparatus according to claim 7, connected to the port and the processor.

* * * * *